(12) United States Patent
Chikugawa

(10) Patent No.: US 7,046,926 B2
(45) Date of Patent: May 16, 2006

(54) LIGHT EMITTING SEMICONDUCTOR DEVICE AND PHOTOGRAPHIC ILLUMINATION APPARATUS EMPLOYING SAME

(75) Inventor: Hiroshi Chikugawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/852,108

(22) Filed: May 25, 2004

(65) Prior Publication Data

US 2004/0240872 A1  Dec. 2, 2004

(30) Foreign Application Priority Data

May 26, 2003  (JP) .............................. 2003-147821

(51) Int. Cl.
*G03B 15/03* (2006.01)

(52) U.S. Cl. ...................... 396/175; 396/182; 396/200; 362/11; 362/18

(58) Field of Classification Search ................ 396/198, 396/62, 175, 182, 200; 362/3, 11, 16–18; 348/370, 371
See application file for complete search history.

(56) References Cited

U.S. PATENT DOCUMENTS

| | | | | |
|---|---|---|---|---|
| 5,406,343 A | * | 4/1995 | Stephenson | 396/174 |
| 5,723,868 A | * | 3/1998 | Hammond et al. | 250/553 |
| 5,778,264 A | * | 7/1998 | Kean | 396/174 |
| 5,895,128 A | * | 4/1999 | Kishimoto et al. | 396/61 |
| 6,256,067 B1 | * | 7/2001 | Yamada | 348/370 |
| 6,749,310 B1 | * | 6/2004 | Pohlert et al. | 362/11 |
| 2003/0218689 A1 | * | 11/2003 | Angeli et al. | 348/370 |

FOREIGN PATENT DOCUMENTS

| | | |
|---|---|---|
| JP | 9-5843 A | 1/1997 |
| JP | 11-195317 A | 7/1999 |
| JP | 2002-207236 A | 7/2002 |

* cited by examiner

*Primary Examiner*—W. B. Perkey
(74) *Attorney, Agent, or Firm*—Birch Stewart Kolasch & Birch LLP

(57) ABSTRACT

Light emitting semiconductor device(s) of the present invention is/are provided with three LED elements by way of lead frame(s) on substrate(s) Reflector(s)—having parabolically curved surface(s) at inner wall(s) thereof is/are installed at periphery or peripheries of these LED elements. Radiative angle(s) of light radiating from such reflector(s) is/are controlled by alteration of height(s) of reflector(s). Such height(s) may be lowered to increase radiative angle(s) θ of light therefrom so as to establish broader irradiative locus or loci and/or such height(s) may be raised to decrease radiative angle(s) θ of light radiating therefrom so as to establish narrower irradiative locus or loci.

23 Claims, 3 Drawing Sheets

Radiative angle θ

Radiative angle θ

LIGHT EMITTING SEMICONDUCTOR DEVICE AND PHOTOGRAPHIC ILLUMINATION APPARATUS EMPLOYING SAME

BACKGROUND OF INVENTION

This application claims priority under 35 USC 119(a) to Patent Application No. 2003-147821 filed in Japan on 26 May 2003, the content of which is incorporated herein by reference in its entirety.

The present invention pertains to light emitting semiconductor device(s) used for photography in the context of camera(s) employing silver halide film(s), digital camera(s) carrying out recording in electronic fashion, and so forth; and pertains to photographic illumination apparatus(es) employing same.

Stroboscopic lamps in which electrical discharge tubes filled with xenon (Xe) gas are made to emit light are commonly employed as conventional photographic illumination apparatuses. As stroboscopic lamps of this type require circuits for increasing voltage, circuits for modulating light, and/or other complicated circuits, reduction in size and reduction in cost are believed to be difficult to achieve. Furthermore, because such stroboscopic lamps employ high-capacitance capacitors, there is also the problem that the large amount of time required for charging thereof can result in lost photographic opportunities. Moreover, in order to set irradiative locus or loci so as to be compatible with field angle(s) of photographic lens(es) it is necessary to insert lens(es) and/or other such optical component(s) to the front of photographic illumination apparatus(es) and/or alter distance(s) between electrical discharge tube(s) and reflector(s) and/or to furthermore alter dimension(s) of reflector(s) to the rear thereof, and/or carry out similar measures for accommodation of same.

In conjunction with the increased brightness of modern light emitting diodes (hereinafter "LEDs"), light emitting semiconductor devices employing, as light sources, LEDs such as that shown in FIG. 5—so-called LAMP-type (artillery-shell-shaped) LEDs—have been used in photographic illumination apparatuses as means for solving the foregoing problems.

At the light emitting semiconductor device (LAMP-type LED) shown in FIG. 5, LED element 101 is provided at bowl-shaped recess 105 in frame 103 by way of electrically conductive paste 102, this LED element 101 being connected to frame 104 by way of Au lead 106. In addition, the LED package is constructed such that the internal components are covered by phototransmissive resin 107 having surface(s) which is/are curved in cup-like fashion. Light emitted toward the back and/or side(s) of LED element 101 is reflected toward the front by the surface of recess 105. When such reflected light exits and passes to the exterior of resin 107, the round resin shape at the front thereof causes the light to be refracted and condensed.

As an example of a photographic illumination apparatus employing light emitting semiconductor device(s) of configuration as shown in FIG. 5, Japanese Patent Application Publication Kokai No. 2002-207236 (hereinafter "Patent Reference No. 1") discloses a photographic illumination apparatus for a camera which is constituted as shown in FIG. 6.

At FIG. 6, photographic illumination apparatus 109 of camera 108 is made up of a plurality of light emitting semiconductor devices 110. At this photographic illumination apparatus 109, adjustment of illumination intensity is carried out by varying the number of light emitting semiconductor devices 1 10 that are made to emit light and/or the amount of light emitted thereby in accordance with distance to photographic subject and/or film sensitivity. Furthermore, by arraying plurality of light emitting semiconductor devices 110 such that they are respectively displaced somewhat relative to the optical axis of photographic lens 111, and/or by arranging some number of light emitting semiconductor device(s) 110 in separated fashion, it has also been possible to adopt methods of light emission consistent with distance to photographic subject.

However, with photographic illumination apparatuses employing light emitting semiconductor devices such as are indicated at Patent Reference No. 1, because it has been impossible to array multiple light emitting diode elements at a single focal position, this has, rather, resulted in the problem of poor light-condensing characteristics. As a result, there has been occurrence of circumstances tending to cause color balance to deteriorate, resulting in so-called chromatic shift, with increasing proximity to the periphery of the light-emitting unit. Furthermore, with the foregoing conventional photographic illumination apparatuses, while there has been improvement in uniformity of radiant intensity over the irradiative locus, there has been limited ability to change the irradiative locus itself in correspondence to changes in field angle for accommodation of wide-angle or telephoto photography and the like.

The present invention was therefore conceived in order to solve the foregoing problems, it being an object thereof to provide a light emitting semiconductor device, and photographic illumination apparatus employing same, permitting prevention of occurrence of chromatic shift and making it possible to ensure appropriate irradiation consistent with photographic lens field angle size.

SUMMARY OF INVENTION

Synopsis of Invention

In order to achieve the foregoing object and/or other objects, a light emitting semiconductor device in accordance with one or more embodiments of the present invention may comprise a plurality of LED elements so as to permit high-intensity light to be obtained, reflector(s) installed at periphery or peripheries of at least a portion of the plurality of LED elements causing intensification of mixture of colors (wavelengths of light) due to multiple reflection of light from at least a portion of the plurality of LED elements, preventing occurrence of chromatic shift. Because photographic illumination apparatus(es) employing such light emitting semiconductor device(s) may permit radiative angle(s) to be controlled through adjustment of height(s) of reflector(s) of light emitting semiconductor device(s), permitting alteration of irradiative locus or loci, it is possible to ensure appropriate irradiation consistent with photographic lens field angle size(s).

Solution Means

More specifically, a light emitting semiconductor device in accordance with one or more embodiments of the present invention may comprise multiple LED elements and may comprise reflector(s), installed at periphery or peripheries of multiple LED elements and reflecting light from multiple LED elements; wherein radiative angle(s) of light radiating from reflector(s) is/are controlled by alteration of height(s) of reflector(s).

As a result of such specific features, high-intensity light capability is ensured due to presence of multiple LED elements, and moreover, multiple light beams from respective LED elements are reflected in multipath fashion, causing intensification of mixture of wavelengths of light and preventing occurrence of chromatic shift. Radiative angle(s) may be varied in correspondence to irradiative locus by altering height(s) of reflector(s). Furthermore, with respect to multiple LED elements, any arbitrary LED element variety or varieties may be used as occasion demands.

If white LED element(s) is/are used in light emitting semiconductor device(s) in accordance with the present invention it will be possible to achieve further miniaturization and reduction in energy consumption.

Furthermore, it is preferred that light emitting semiconductor device(s) in accordance with embodiment(s) of the present invention be such that multiple LED elements include LED element(s) emitting, respectively, red, green, and blue light. This being the case, in the event of occurrence of change in color and/or luminance, it will be possible through separate adjustment of three primary colors to easily adjust and correct such change.

Furthermore, it is preferred that light emitting semiconductor device(s) in accordance with embodiment(s) of the present invention be such that inner wall(s) of reflector(s) have parabolic and/or spherically curved surface(s) in order to increase directionality of light.

Furthermore, it is preferred that light emitting semiconductor device(s) in accordance with embodiment(s) of the present invention be such that reflector(s) is/are made up of two or more reflectors joinable so as to permit extension in height direction(s) thereof. This being the case, it will be possible through attachment and/or removal of reflector(s) to effect greater change in reflector height(s), permitting increase in the range over which radiative angle(s) of light radiating from reflectors(s) may be controlled.

Use of light emitting semiconductor device(s) in accordance with embodiment(s) of the present invention makes it possible to provide photographic illumination apparatus(es) for which chromatic shift is prevented and appropriate irradiation consistent with photographic lens field angle size is ensured. Here, such a photographic illumination apparatus may employ one or may employ more than one light emitting semiconductor device.

It is preferred that photographic illumination apparatus(es) employing a plurality of light emitting semiconductor devices in accordance with embodiment(s) of the present invention be such that at least one radiative angle of at least one of the plurality of light emitting semiconductor devices is set so as to be different from at least one radiative angle of at least one other of the plurality of light emitting semiconductor devices. This being the case, it will be possible through manual and/or automatic operation(s) to effect selection of light emitting semiconductor device(s) that is/are made to emit light in correspondence to photographic lens field angle, permitting increase in the selectable range of irradiative loci. The present invention is not limited to situations where one light emitting semiconductor device is made to emit light at such time; it being possible, for example, to achieve increased light intensity through emission of light by a plurality thereof. Increasing light intensity is particularly effective when photographing over long distances.

It is preferred that photographic illumination apparatus(es) employing a plurality of light emitting semiconductor devices in accordance with embodiment(s) of the present invention be such that at least one of the plurality of light emitting semiconductor devices is arranged so as to have at least one axis of emission that is different from at least one axis of emission of at least one other of the plurality of light emitting semiconductor devices. In such a situation as well it will be possible to increase the selectable range of irradiative loci by, through manual and/or automatic operation(s), effecting selection of light emitting semiconductor device(s) that is/are made to emit light in correspondence to photographic lens field angle. It may, for example, be possible to broaden irradiative locus or loci by causing light emitting semiconductor devices having different axes of emission to simultaneously emit light.

Moreover, irradiative locus or loci and/or amount(s) of light may be adjusted by arranging so as to have different respective optical axes a plurality of light emitting semiconductor devices having different radiative angles.

By adopting a photographic illumination apparatus employing three light emitting semiconductor devices in accordance with embodiment(s) of the present invention arranged in respectively adjacent fashion, radiative angle(s) of the centrally located light emitting semiconductor device being set so as to be smaller than radiative angle(s) of the other two light emitting semiconductor devices, irradiative locus or loci ranging from extremely narrow to extremely broad can be accurately irradiated.

By adopting a photographic illumination apparatus employing three light emitting semiconductor devices in accordance with embodiment(s) of the present invention arranged in respectively adjacent fashion, radiative angle(s) of the centrally located light emitting semiconductor device being set so as to be larger than radiative angle(s) of the other two light emitting semiconductor devices, extremely broad irradiative locus or loci can be accurately irradiated.

By employing light emitting semiconductor device(s) that include LED element(s) emitting, respectively, red, green, and blue light, the photographic illumination apparatus being such that respective light emitting diode elements are respectively made to emit light in temporally staggered fashion during a single photographic exposure event, it may be possible to carry out color adjustment relative to CCD(s) (charge-coupled device(s)) and/or it may simultaneously be possible to adjust amount(s) of emitted light. Particular effectiveness may be achieved when photographic illumination apparatus(es) employing such light emitting semiconductor device(s) is/are applied to digital camera(s).

BRIEF DESCRIPTION OF DRAWINGS

FIG. 1(*b*) is a front sectional view showing broadened irradiative locus in schematic fashion; FIG. 1(*c*) is a curve showing radiative characteristics when irradiative locus has been broadened; FIG. 1(*d*) is a plan view showing in schematic fashion the structure of a light emitting semiconductor device associated with an embodiment of the present invention when irradiative locus has been narrowed; FIG. 1(*e*) is a front sectional view showing narrowed irradiative locus in schematic fashion; and FIG. 1(*f*) is a curve showing radiative characteristics when irradiative locus has been narrowed.

DESCRIPTION OF PREFERRED EMBODIMENTS

Below, embodiments of the present invention are described with reference to the drawings.

Figure 1:
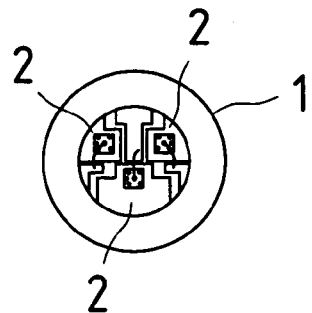
FIG. 1(*a*) is a plan view showing in schematic fashion the structure of a light emitting semiconductor device associated with an embodiment of the present invention when irradiative locus has been broadened.
Figure 1:
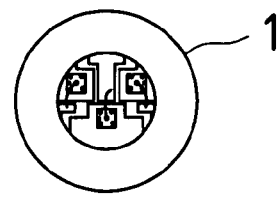
Figure 1:
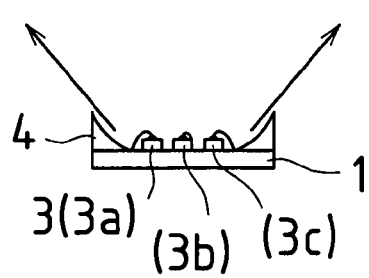
Figure 1:
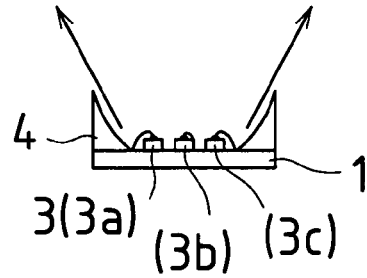
Figure 1:
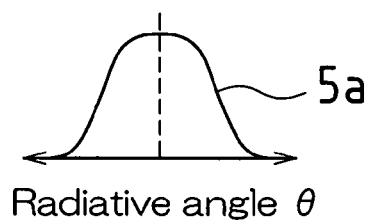
Figure 1:
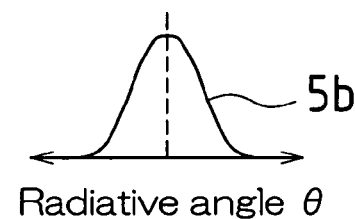

FIG. 1(a) and (d) show in schematic fashion the structure of a light emitting semiconductor device associated with an embodiment of the present invention and external appearances thereof; FIG. 1 (b) and (e) are sectional views showing internal structure thereof as viewed from the front; and FIG. 1 (c) and (f) show radiative characteristics of light radiating from the light emitting semiconductor device. At FIG. 1 (c) and (f), the horizontal axis is radiative angle θ and the vertical axis is intensity of radiated light (both being plotted in arbitrary units). Here, FIG. 1 (a), (b), and (c) indicate a situation in which irradiative locus has been broadened; and FIG. 1 (d), (e), and (f) indicate a situation in which irradiative locus has been narrowed.

At the light emitting semiconductor device shown in FIG. 1, red LED element 3a, green LED element 3b, and blue LED element 3c—constituting LED elements 3—are arranged in a single plane over substrate(s) 1 by way of intervening lead frame(s) 2 such that each is located at one vertex of a triangle. Attached peripheral to the location at which LED elements 3 are arranged is/are reflector(s) 4 having parabolically curved surface(s) at inner wall(s) thereof. Note that the positional relationship among respective LED elements 3a, 3b, and 3c is not limited hereto, it being possible to employ any type of positional relationship thereamong.

FIG. 1 (b) shows a light emitting semiconductor device in which reflector(s) 4 is/are lowered; FIG. 1 (e) shows a light emitting semiconductor device in which reflector(s) 4 is/are raised. Lowering reflector(s) 4 in such light emitting semiconductor device increases radiative angle(s) θ as indicated at curve 5a shown in FIG. 1 (c), permitting broad irradiative locus to be set. Conversely, raising reflector(s) 4 decreases radiative angle(s) θ as indicated at curve 5b shown in FIG. 1 (f), permitting narrow irradiative locus to be set. Thus, at the light emitting semiconductor device shown in FIG. 1, it is possible for any desired irradiative locus to be set in correspondence to field angle by changing height(s) of reflector(s) 4 as appropriate.

Figure 2:
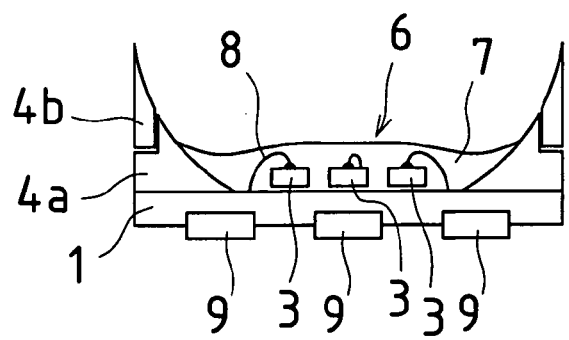
FIG. 2 is a front sectional view showing in schematic fashion a light emitting semiconductor device associated with an embodiment of the present invention.

FIG. 2 is a sectional view, shown as viewed from the front, of the internal structure of a light emitting semiconductor device in which reflector 4b has been attached to reflector 4a. Attachment and/or removal of reflector 4b makes it possible to change inner wall height(s) and to carry out control from broad radiative angle(s) to narrow radiative angle(s). In addition, the package 6 is of such construction that LED elements 3 are covered by highly phototransmissive resin 7. Such structure makes it possible to achieve LED elements 3 of stable quality; and by minimizing difference(s) in refractive index at interface(s) of LED elements 3, it is possible to improve the efficiency with which light from LED elements 3 is transferred to the exterior. As resin 7, commercially available epoxy resin and/or the like may be used. LED elements 3 are connected to lead terminals 9 for connection to electrical power and/or the like (not shown) through use of Au leads 8.

Furthermore, because LED element response characteristics may range from several microseconds to several tens of microseconds, making it possible for emission of light to be made to occur any number of times over a short period of time, it is possible by causing, for example, red LED element 3a, green LED element 3b, and/or blue LED element 3c to respectively emit light individually to adjust amount(s) of emitted light and/or carry out color adjustment relative to CCD(s). As a result, where such light emitting semiconductor device(s) is/are to be used in digital cameras, it is possible to employ same in photographic illumination apparatuses accommodating high frame capture rates to the extent permitted by the time for transfer to memory and CCD signal processing.

Moreover, as the size of the light emitting semiconductor device with reflector(s) attached is on the order of from several millimeters to 10 millimeters, the light emitting semiconductor device permits adequate reduction in size.

Figure 3:
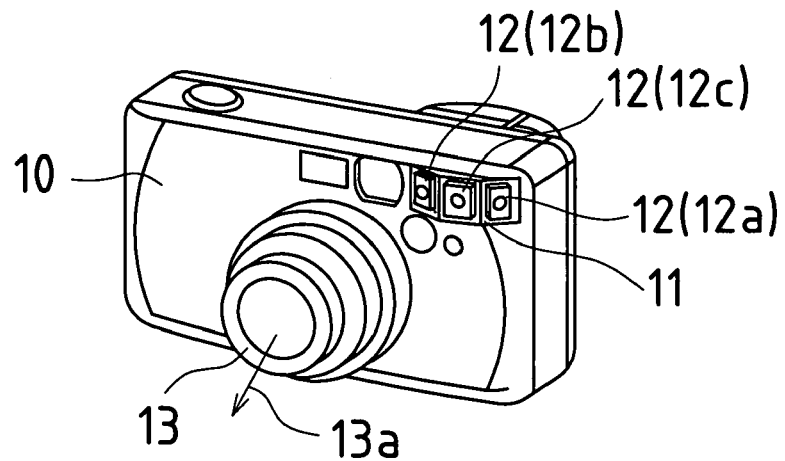
FIG. 3 is an oblique schematic view showing the external construction of a camera equipped with a photographic illumination apparatus employing light emitting semiconductor device(s) associated with embodiment(s) of the present invention.

FIG. 3 shows an example of a camera equipped with a photographic illumination apparatus employing the light emitting semiconductor device of the present embodiment.

Arranged in adjacent fashion at photographic illumination apparatus 11 shown in FIG. 3 there are, at camera 10, three light emitting semiconductor devices 12 (12a, 12b, 12c). At this photographic illumination apparatus 11, it is possible by selecting among available permutations in amount(s) of light and irradiative locus or loci at respective light emitting semiconductor devices 12a, 12b, and 12c to easily carry out adjustment of irradiative locus or loci and/or brightness and/or other such irradiative conditions in correspondence to distance to photographic subject and/or size of field angle at photographic lens 13.

For example, with a photographic illumination apparatus 11 in which light emitting semiconductor devices 12a, 12b located to either side among the three light emitting semiconductor devices 12 are set so as to have wide radiative angle(s) for broad irradiative locus or loci, in combination with which light emitting semiconductor device 12c centrally located thereamong is set so as to have narrow radiative angle(s) for narrow irradiative locus or loci, the following sorts of adjustments might be possible. During photography in which the field angle of photographic lens 13 is narrow, light emitting semiconductor device 12c, having narrow radiative angle(s), might be made to emit light; and during photography in which the field angle thereof is wide, light emitting semiconductor devices 12a, 12b, having wide radiative angle(s), might be made to emit light. Furthermore, in situations where field angle might not be very wide but more intense light is required because distance to photographic subject is large, it is also possible that the three light emitting semiconductor devices 12a, 12b, and 12c would be made to emit light so as to increase the amount of light. Furthermore, radiative angle(s) at light emitting semiconductor devices 12 may be set manually prior to carrying out photography, and selection of light emitting semiconductor device(s) that will emit light may be carried out automatically in accordance with conditions set at the camera.

Note that whereas at FIG. 3 the three light emitting semiconductor devices 12 are arranged at what is the top right as one faces camera 10, the location at which these are arranged is not limited thereto.

Figure 4:
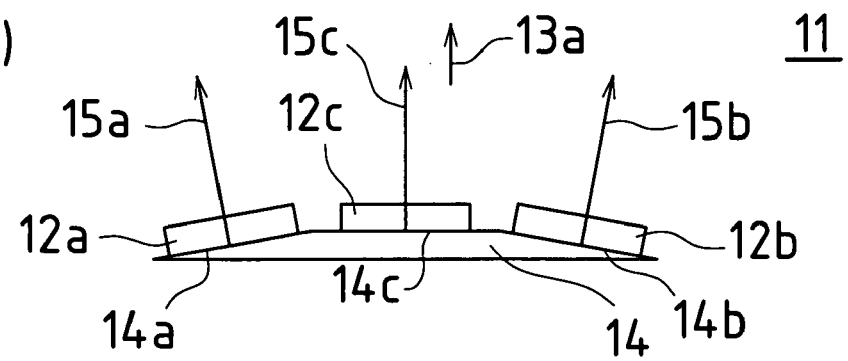
FIG. 4(a) is a drawing showing arrangement of respective light emitting semiconductor devices in the photographic illumination apparatus of the camera of FIG. 3.
FIG. 4(b) is a curve showing radiative characteristics.
Figure 4:
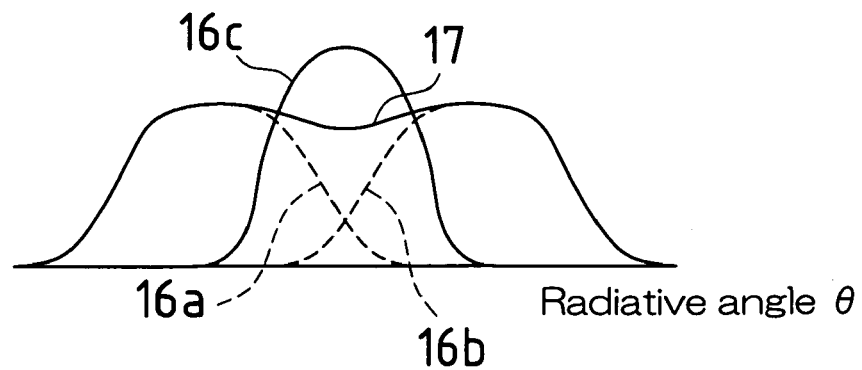
Figure 5:
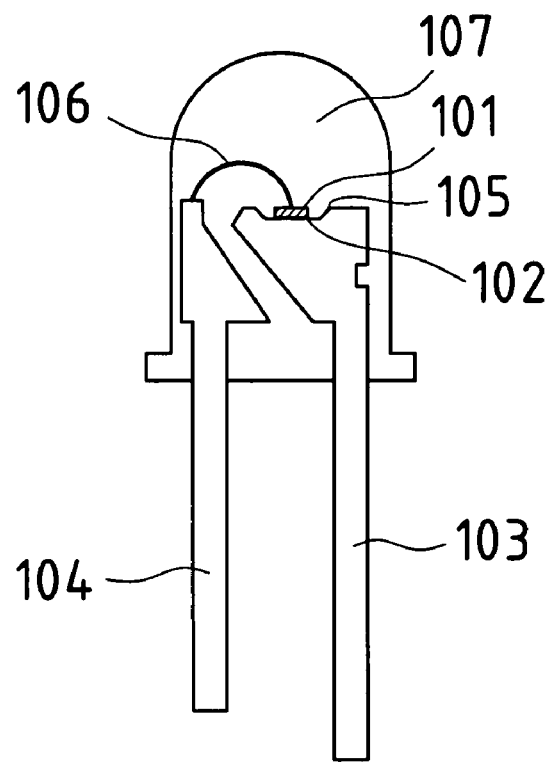
FIG. 5 is a front sectional view showing a conventional light emitting semiconductor device in schematic fashion.
Figure 6:
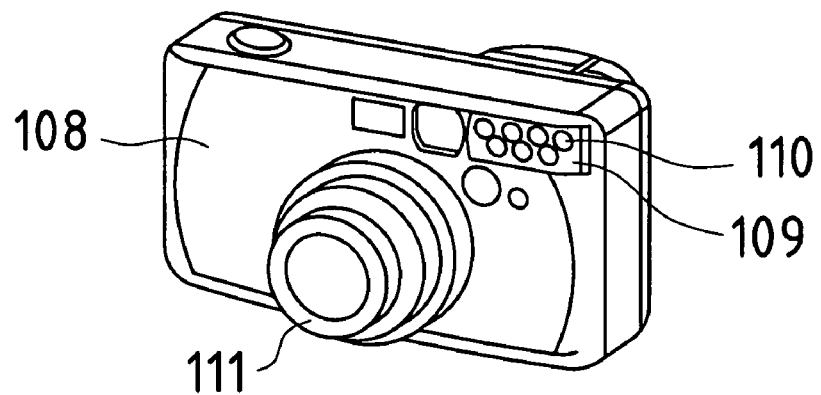
FIG. 6 is an oblique schematic view showing the external construction of a camera equipped with a conventional photographic illumination apparatus.

FIG. 4(a) shows in schematic fashion the constitution of a photographic illumination apparatus 11 (see FIG. 3) in which the angles of light emitting semiconductor devices 12 installed therein are varied and which employs two light emitting semiconductor devices 12a, 12b having wide radiative angle(s) and one light emitting semiconductor device 12c having narrow radiative angle; FIG. 4(b) shows radiative characteristics of these light emitting semiconductor devices 12. At this photographic illumination apparatus 11, light emitting semiconductor device 12c having narrow radiative angle is arranged at flat region 14c in the center of platform 14 constituting a truncated quadrangular pyramid (the longitudinal cross-section of which is more or less trapezoidal), and light emitting semiconductor devices 12a, 12b having wide radiative angle(s) are respectively arranged at inclined regions 14a, 14b to the left and right thereof. Moreover, optical axis 15c of central light emitting semiconductor device 12c is arranged so as to be more or less parallel to optical axis 13a of lens 13 of camera 10 (also see FIG. 3), while optical axis 15a of light emitting semiconductor device 12a and optical axis 15b of light emitting semiconductor device 12b are each arranged so as to be directed slightly outward relative to optical axis 13a of lens 13.

Radiative characteristics of respective light emitting semiconductor devices 12a, 12b, 12c are respectively indicated at curves 16a, 16b, 16c. Note that radiative characteristics of light emitting semiconductor device 12a and light emitting semiconductor device 12b are set so as to be more or less mutually identical and so as to have radiative angle(s) wider than that of light emitting semiconductor device 12c.

At photographic illumination apparatus 11 in FIG. 4(a), when the two light emitting semiconductor devices 12a, 12b are made to emit light the resulting radiative characteristics are as indicated at curve 17, which represents superposition of the two curves 16a, 16b. Accordingly, photography in which a wide field angle is employed can be accommodated by causing the two light emitting semiconductor devices 12a, 12b to emit light. Furthermore, photography in which a narrow field angle is employed can be accommodated by causing the centrally arranged light emitting semiconductor device 12c to emit light.

Furthermore, at FIG. 4(a), it is possible to carry out setting(s) so as to permit irradiative locus or loci ranging from extremely narrow to extremely broad to be irradiated. This might be accomplished by leaving the narrow radiative angle of light emitting semiconductor device 12c as it is while further increasing the radiative angle(s) of the light emitting semiconductor devices 12a, 12b to either side thereof or arranging optical axes 15a, 15b such that they are more outwardly directed by increasing the angle(s) thereof relative to lens optical axis 13a. In such case, even if the optical axes of light emitting semiconductor devices 12a, 12b at either side are moved too far apart in an attempt to broaden irradiative locus or loci and the amount of light in the central region of the irradiative locus or loci would be insufficient with only light emitting semiconductor devices 12a, 12b, by causing central light emitting semiconductor device 12c to emit light in an appropriate amount such as will compensate for the amount of that insufficiency it is possible to achieve uniform irradiation over extremely broad irradiative locus or loci.

Furthermore, in contrast to the foregoing embodiment, it is also possible to arrange centrally light emitting semiconductor device 12c having wide radiative angle and to arrange to either side thereof light emitting semiconductor devices 12a, 12b having narrow radiative angle(s). In such case, causing central light emitting semiconductor device 12c to emit light will permit irradiation of broad irradiative locus or loci. Moreover, causing all three light emitting semiconductor devices 12a, 12b, 12c to light will permit irradiation of still broader irradiative locus or loci. To achieve irradiation with uniform brightness at such time, the amounts of light from respective light emitting semiconductor devices 12a, 12b, 12c may be adjusted.

The present invention may be embodied in a wide variety of forms other than those presented herein without departing from the spirit or essential characteristics thereof. The foregoing embodiments and working examples, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are moreover within the scope of the present invention.

What is claimed is:

1. A light emitting semiconductor device comprising:
   a plurality of light emitting diode elements; and
   one or more reflectors installed peripherally of the plurality of light emitting diode elements and reflecting light therefrom;
   wherein the one or more reflectors radiate one or more radiative angles of light, said angles being controlled by adjusting the height of at least a portion of said one or more reflectors.

2. A light emitting semiconductor device according to claim 1 wherein at least a portion of the plurality of light emitting diode elements comprises a white light emitting diode element.

3. A light emitting semiconductor device according to claim 1 wherein the plurality of light emitting diode elements includes one or more light emitting diode elements emitting, respectively, red, green, and blue light.

4. A light emitting semiconductor device according to claim 1 wherein at least one of the reflectors forms at least one inner wall having a parabolic or spherical curvature.

5. A light emitting semiconductor device according to claim 1 wherein at least one of the reflectors is made of two or more reflectors joinable to permit a height adjustment in the reflectors.

6. A photographic illumination apparatus employing at least one light emitting semiconductor device comprising:
   a plurality of light emitting diode elements; and
   one or more reflectors installed peripherally of the plurality of light emitting diode elements and reflecting light therefrom;
   wherein the one or more reflectors radiate one or more radiative angles of light, said angles being controlled by adjusting the height of at least a portion of said one or more reflectors.

7. A photographic illumination apparatus according to claim 6, wherein at least one of the plurality of light emitting semiconductor devices radiates at least one radiative angle of light different from a radiative angle of light radiating from another of said plurality of light emitting semiconductor devices.

8. A light emitting semiconductor device according to claim 1, wherein at least one of the plurality of light emitting semiconductor devices is arranged to have at least one axis of emission that is different from at least one axis of emission of another of said plurality of light emitting semiconductor devices.

9. A photographic illumination apparatus according to claim 7, wherein at least one of the plurality of light emitting semiconductor devices is arranged to have at least one axis of emission that is different from at least one axis of emission of another of said plurality of light emitting semiconductor devices.

10. A photographic illumination apparatus according to claim 6, wherein the plurality of light emitting semiconductor devices includes three light emitting semiconductor devices arranged in respectively adjacent fashion and radiate at least one radiative angle of light from one light emitting semiconductor device centrally located among the three light emitting semiconductor devices set to be smaller than the radiative angle or angles of light radiating from the other two light emitting semiconductor devices.

11. A photographic illumination apparatus according to claim 6, wherein the plurality of light emitting semiconductor devices includes three light emitting semiconductor devices arranged in respectively adjacent fashion and radiate at least one radiative angle of light from one light emitting semiconductor device centrally located among the three light emitting semiconductor devices set to be larger than the radiative angle or angles of light radiating from the other two light emitting semiconductor devices.

12. A light emitting semiconductor device according to claim 3;
said device when activated illuminating a target in a photographic exposure event;
wherein at least a portion of the light emitting diode elements are controlled to emit light in temporally staggered fashion during a single said photographic exposure event.

13. A photographic illumination apparatus according to claim 6, wherein at least a portion of the plurality of light emitting diode elements comprises a white light emitting diode element.

14. A photographic illumination apparatus according to claim 6, wherein the plurality of light emitting diode elements includes one or more light emitting diode elements emitting, respectively, red, green, and blue light.

15. A photographic illumination apparatus according to claim 6, wherein at least one of the reflectors forms at least one inner wall having a parabolic or spherical curvature.

16. A photographic illumination apparatus according to claim 6, wherein at least one of the reflectors is made of two or more reflectors joinable to permit a height adjustment in the reflectors.

17. A photographic illumination apparatus according to claim 14,
said apparatus when activated illuminating a target in a photographic exposure event;
wherein at least a portion of the light emitting diode elements in the light emitting semiconductor device are controlled to emit light in temporally staggered fashion during a single photographic exposure event.

18. The light emitting semiconductor apparatus of claim 1 wherein at least one of said one or more reflectors includes a periphery shaped to receive a reflector extension for extending at least a portion of the at least one reflector.

19. The light emitting semiconductor apparatus of claim 1 including an annular reflector extension mounted on a periphery of at least one of the one or more reflectors for adjusting the height of the at least one of the one or more reflectors.

20. The light emitting semiconductor apparatus of claim 1 wherein each of said plurality of light emitting diodes has an optical axis and wherein the optical axis of a first one of said plurality of light emitting diodes is non-parallel to the optical axis of a second one of said plurality of light emitting diodes.

21. The light emitting semiconductor apparatus of claim 6 wherein at least one of said one or more reflectors includes a periphery shaped to receive a reflector extension for extending at least a portion of the at least one reflector.

22. The light emitting semiconductor apparatus of claim 6 including an annular reflector extension mounted on a periphery of at least one of the one or more reflectors for adjusting the height of the at least one of the one or more reflectors.

23. The light emitting semiconductor apparatus of claim 6 wherein each of said plurality of light emitting diodes has an optical axis and wherein the optical axis of a first one of said plurality of light emitting diodes is non-parallel to the optical axis of a second one of said plurality of light emitting diodes.

* * * * *